United States Patent
Chard et al.

(10) Patent No.: US 9,621,304 B2
(45) Date of Patent: Apr. 11, 2017

(54) SELF-LEARNING AND SELF-CORRECTING DECODING OF BMC ENCODED SIGNAL

(71) Applicant: Texas Instruments Incorporated, Dallas, TX (US)

(72) Inventors: Gary Franklin Chard, Murphy, TX (US); Erick Omar Torres, Allen, TX (US); Karan Singh Jain, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 98 days.

(21) Appl. No.: 14/788,147

(22) Filed: Jun. 30, 2015

(65) Prior Publication Data

US 2015/0381317 A1    Dec. 31, 2015

Related U.S. Application Data

(60) Provisional application No. 62/019,150, filed on Jun. 30, 2014.

(51) Int. Cl.
| | | |
|---|---|---|
| *H04L 1/00* | (2006.01) | |
| *H03M 13/15* | (2006.01) | |
| *H03M 5/12* | (2006.01) | |

(52) U.S. Cl.
CPC ............ *H04L 1/0046* (2013.01); *H03M 5/12* (2013.01); *H03M 13/151* (2013.01)

(58) Field of Classification Search
CPC .... H04L 1/0046; H04L 7/033; H03M 13/151; H03M 5/12
See application file for complete search history.

(56) References Cited

U.S. PATENT DOCUMENTS

| | | | | |
|---|---|---|---|---|
| 4,599,736 A | * | 7/1986 | Hoppe | G11B 20/1419 327/31 |
| 2011/0261969 A1 | * | 10/2011 | Elkhatib | H04L 7/033 381/22 |

* cited by examiner

*Primary Examiner* — Albert Decady
*Assistant Examiner* — Kyle Vallecillo
(74) *Attorney, Agent, or Firm* — Michael A Davis, Jr.; Charles A. Brill; Frank D. Cimino

(57) ABSTRACT

A method of decoding a biphase mark coded (BMC) data stream. A BMC encoded signal (BMC signal) including a preamble and data payload is received at a receiver which includes a BMC decoder state machine (state machine). The preamble is processed using the state machine including measuring a total duration spanning at least three transitions to provide a ≥2 UI duration measure, a calculated 0.75 UI duration value (0.75 UI duration value) is generated from the ≥2 UI duration measure, and the 0.75 UI duration value is compared to a programmed UI range. Provided the 0.75 UI duration value is within the programmed UI range data, respective bits are extracted bit-by-bit from the data payload using the 0.75 UI duration value to obtain unencoded data.

16 Claims, 4 Drawing Sheets

… (1) …

SELF-LEARNING AND SELF-CORRECTING DECODING OF BMC ENCODED SIGNAL

CROSS REFERENCE TO RELATED APPLICATIONS

This application claims the benefit of Provisional Application Ser. No. 62/019,150 entitled "SELF LEARNING AND SELF CORRECTING MULTI PHASE DECODING OF BMC ENCODED SIGNAL", filed Jun. 30, 2014, which is herein incorporated by reference in its entirety.

FIELD

Disclosed embodiments relate to decoding in communication systems that use signals encoded with biphase mark coding.

BACKGROUND

In digital communication systems, data is generally transmitted as a sequence of high and low voltage signals without an accompanying clock signal. In addition, most communication systems support multiple sampling rates of the signal. For an unknown digital signal, a receiver can therefore need to determine the incoming sampling rate. Rate determination of and synchronization to a received signal are often difficult to achieve for a conventional digital signal, particularly if there are relatively long stretches of either high digital values or low digital values. During such periods, there are no transitions in the signal that can be used as a reference for synchronization or rate synchronization.

Biphase mark coding (BMC) addresses this difficulty in conventional digital signals. Like a traditional digital signal, for a BMC coded signal one bit is transmitted for each clock cycle. Unlike a traditional digital signal, however, between each bit there is a signal transition in polarity on each edge (from high to low or from low to high). In order to transmit a "1" value, an additional transition besides on the edges also occurs after half a clock cycle (a clock cycle can also be referred to as a "cell"). To transmit a "0" value, no transition occurs in the middle of a cell. Therefore, to decode a signal encoded using BMC, a determination in each cell is made as to whether a transition occurs in the middle of the cell or not. If no transition occurs, a "0" value is interpreted, and if a transition occurs in the middle of the cell a "1" value is interpreted.

In one application for a BMC decoder a BMC decoder is optionally used in the receive direction of a Universal Serial Bus (USB) power delivery (PD) modem instead of the USB PD radio frequency (RF) demodulation scheme which operates directly on the input USB Type C connector CC wire (DUT input). The BMC decoder reverses the BMC encoding process by extracting the original data message from the BMC encoded signal by oversampling the BMC encoded input signal. When enabled, the BMC decoder constantly searches for the preamble of the signal, and uses the preamble to lock on where the BMC decoder determines the clock rate of the signal by detecting 90 and 270 degree phases of the clock.

SUMMARY

This Summary briefly indicates the nature and substance of this Disclosure. It is submitted with the understanding that it will not be used to interpret or limit the scope or meaning of the claims.

Disclosed embodiments recognize a challenging part of decoding a biphase mark coding (BMC) encoded signal is that the BMC signal is encoded in two different frequencies where data rate is assumed to be constant. The data rate in BMC is equal to clock rate when transmitting a one bit and when transmitting a zero bit the data rate is one half of the clock rate. In practical systems the data rate has variations (e.g., due to temperature changes) which can lead to errors in data recovery.

Disclosed embodiments also recognize in a BMC-based communication system before any data is transferred there is a preamble phase which is "bit banging" (i.e., alternating bits, 0101 . . . ) that has an associated time which is utilized in disclosed embodiments for learning about the characteristics of the data rate of the BMC encoded signal and thus improving the data recovery. While as described above conventional BMC decoders extract the clock rate/data rate by detecting 90 and 270 degree phases of a clock, such conventional BMC decoders require complex decoding hardware which limit the data rate it can support. In contrast, disclosed BMC decoders do not have this requirement and can adapt to any data rate by using a self-learning and self-correcting algorithm realized by a BMC decoder including a decoder state machine which has at least two, and optionally three phases, which is applied to the preamble of the signal. As used herein UI=one bit time.

Disclosed embodiments include methods of BMC signal decoding. A BMC encoded signal (BMC signal) comprises a preamble and data payload, as well as typically in addition other fields including a packet header, a message body, a cyclic redundancy check (CRC), and an end of packet, which is received at a receiver that includes a BMC decoder including a BMC decoder state machine (state machine). The preamble is processed using the BMC decoder including (i) measuring a total duration spanning at least three transitions to provide a ≥2 UI duration measure, (ii) generating a calculated 0.75 UI duration value from the ≥2 UI duration measure, and (iii) comparing the 0.75 UI duration value to a programmed UI range. Provided the 0.75 UI duration value is within the programmed UI range data, respective bits are extracted bit-by-bit from the data payload using the 0.75 UI duration value to obtain unencoded data, that is generally provided to a receive (RX) packet engine as an extracted message when the BMC decoder is enabled.

BRIEF DESCRIPTION OF THE DRAWINGS

Reference will now be made to the accompanying drawings, which are not necessarily drawn to scale, wherein.

DETAILED DESCRIPTION

Figure 1:
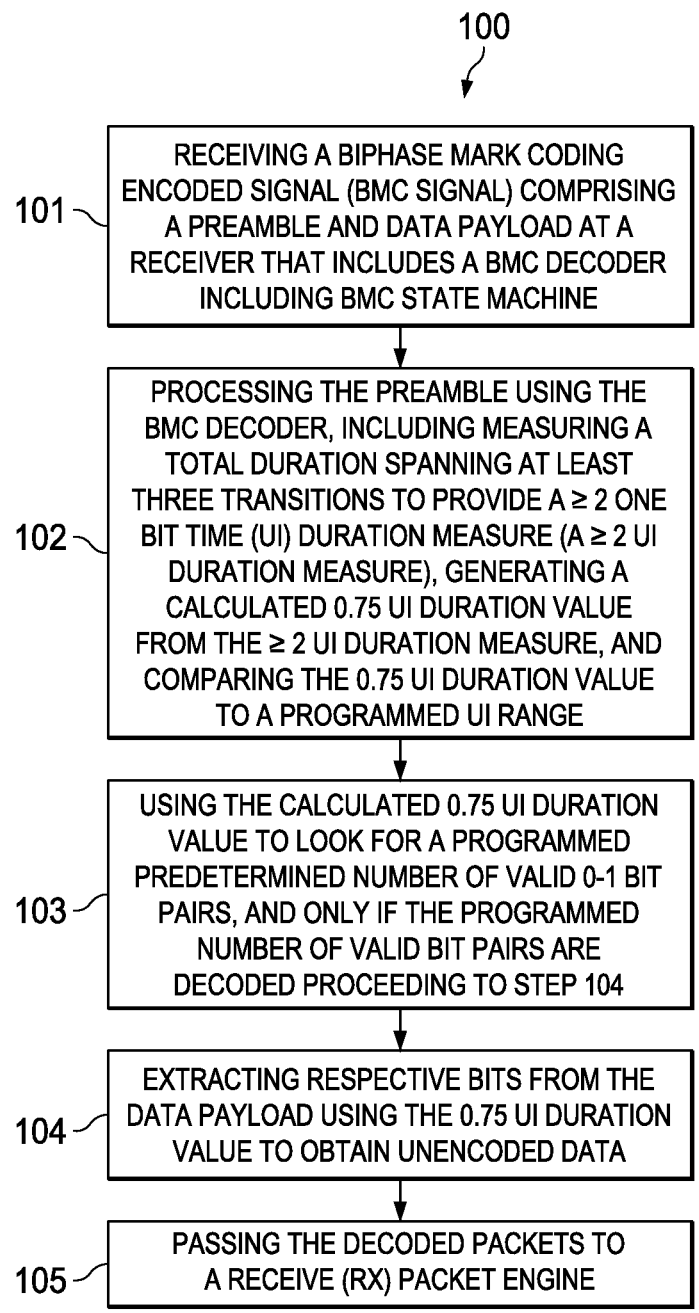
FIG. 1 is a flow chart that shows steps in an example method of decoding a BMC encoded data stream, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1 is a flow chart that shows steps in an example method 100 of decoding a BMC encoded data stream, according to an example embodiment. The disclosed BMC decoder 300 shown in FIG. 3 described below including a BMC state machine 320 that together with associated blocks implements two decoding phases, and optional three decoding phases which enables practice of method 100. Step 101 comprises receiving a BMC encoded signal (BMC signal) comprising a preamble and a data payload at a receiver which includes a disclosed BMC decoder.

Step 102 comprises processing the preamble using the BMC decoder, including measuring a total duration spanning at least three transitions to provide a ≥2 UI duration measure, generating a calculated 0.75 UI duration value from the ≥2 UI duration measure, and comparing the 0.75 UI duration value to a programmed UI range. Step 102 corresponds to what is referred to as phase 1 which may be considered a frequency lock step.

In step 102/phase 1 the total duration (interval or time) across at least three transitions in the preamble is measured using a faster clock relative to the speed of the signal transitions. For conventional BMC signaling, with each packet the BMC transmitter will send 64 bits in the preamble of the packet, which specifically is the sequence of a zero bit followed by a one bit repeated consecutively a total of 32 times {32{2'b01}}. During the measurement to provide the ≥2 UI duration measure, the distance/duration (in clock cycles) between 3 consecutive input data transitions is measured starting with a transition where there is an input data transition measured coincident with each rising clock edge. This is equal to 2 UI during the preamble transmission being 3 BMC transitions, or ≥2 UI for >3 transitions, where a ≥2 UI duration is recognized to generally be the minimum duration needed for decoding accuracy.

One particular embodiment uses a 6 UI duration measure. From the ≥2 UI duration measure the calculated 0.75 UI duration value can be computed which will subsequently be used to distinguish each bit in the data payload for data extraction (step 104, described below) between a 0.5 UI (a one (1) bit) and a 1.0 UI (a zero (0) bit). The calculated 0.75 UI duration value can be computed from the ≥2 UI duration measure with an adder which divides by 8 (e.g., using a 3 bit right shift) to implement computing the 0.75 UI value from the 2 UI duration*⅜=0.75 UI or from a 6 UI duration/8=0.75 UI. A plurality of ≥2 UI durations measurements can be repeated (within the same preamble, if programmed to do so), and the additional ≥2 UI duration measure result(s) averaged with previous ≥2 UI duration measurement(s), such as using a simple moving average. If the resulting calculated 0.75 UI duration value falls between programmed limits, such as from 0.5 UI to 1 UI, the method continues to the optional preamble lock phase (phase 2/step 103 described below).

Step 103 is referred to as phase 2 comprises an optional preamble lock that comprises observing a programmed number of 0/1 preamble bit pairs. The method can further comprise user programming for setting the number of 0,1 bit pairs utilized, where the validation of the number of preamble bit pairs being subsequent to step 102/phase 1 (frequency lock) functions to confirm the frequency lock step.

Figure 2A:
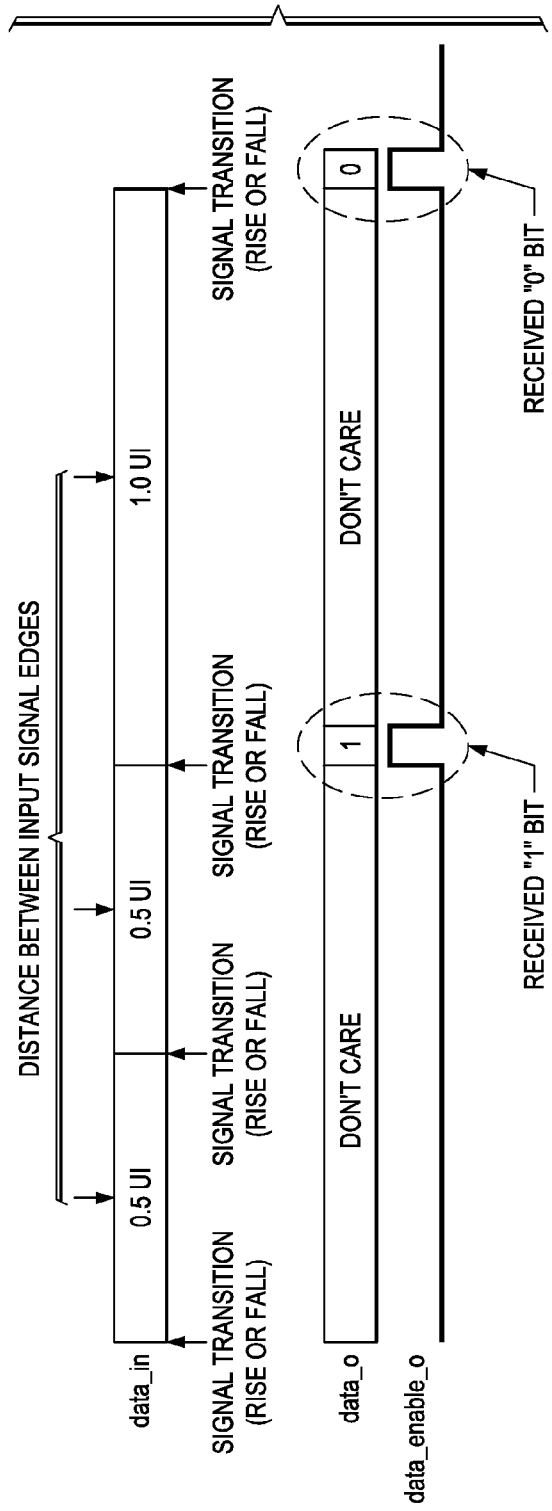
FIG. 2A shows zero and one bit recovery examples provided by a disclosed BMC decoder and FIG. 2B shows the distance between transition window definitions for a disclosed BMC decoder.
Figure 2B:
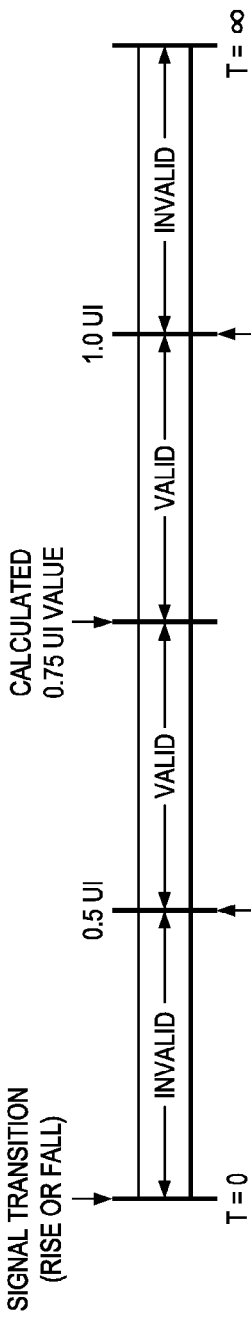

During the optional preamble lock phase (phase 2), the calculated 0.75 UI duration value obtained from phase 1 is used to look for a programmed predetermined number of valid 0-1 bit pairs, and only if the programmed number of valid bit pairs are successfully decoded the method proceeds to phase 3 comprising data extraction from the data payload. An invalid bit time occurs when the transition time (or lack of a signal transition, rise or fall) between adjacent bits is outside a range, either exceeding an upper programmed value that is >the calculated 0.75 UI value, or is below a lower programmed value that is <the calculated 0.75 UI value, such as shown in FIG. 2B described below being in the example valid bit time range from 0.5 UI to 1.0 UI, or between 0.6 UI to 0.9 UI as another example range. If invalid, the method returns to step 102/phase 1.

Given for conventional BMC signaling the BMC transmitter will send 64 bits as a preamble as noted above, {32{2'b01}}, the capability of analyzing a programmable number of the one/zero bit pairs is provided as an option to ensure the BMC decoder is locked onto a valid preamble sequence, which may be particularly helpful in a noisy environment before sending the decoded bit stream to the RX packet engine. The preamble lock thus provides a flexible filtering mechanism to reject noisy bit streams before engaging the RX packet engine.

Step 104 comprises extracting respective bits bit-by-bit from the data payload using the 0.75 UI duration value to obtain unencoded data which corresponds to phase 3 (data extraction). The method used to extract data (step 104) can be the same as used for bit determination during the preamble lock phase (phase 2, i.e., using the calculated 0.75 UI duration value) as described above. For one particular example, when enabled, the BMC decoder can decode a 300 Kbps (+/−10%) BMC data stream and pass the decoded bits to a RX packet engine.

In step 104, the BMC state machine is either looking in the data payload of the BMC signal for a valid one UI wide window between transitions (indicating reception of a zero bit) or for two consecutive 0.5 UI wide windows between two adjacent transition (indicating reception of a one bit) using the calculated 0.75 UI duration value. See FIG. 2A which shows zero bit and one bit recovery examples provided by a disclosed BMC decoder. Data_o shown represents the decoded data output generated by a disclosed BMC decoder from a received BMC encoded signal, and data_enable_o represents the data enable, that when asserted, indicates there is valid data on the data_o output signal. Also see FIG. 2B which shows the distance between transition window definitions for a disclosed BMC decoder that uses an example valid bit time range of from 0.5 UI to 1.0 UI. An invalid bit time is shown as <0.5 UI or >1.0 UI.

Step 105 comprises passing the decoded packets to a RX packet engine. Once the respective bits in the data payload are determined in step 104 they are generally passed to a RX packet engine until either the BMC decoder determines an invalid bit time is received or a partial one (i.e., half of a one bit time which is an error case that is detected) is received.

In either case, the packet is terminated and the state machine can return to step 102 (frequency lock/phase 1). Step 105 can include using a user programmed specification for deciding whether to reject for (frequency or data content) which are out of a programmed specification, and if so processing of the BMC signal is terminated.

Advantages of disclosed BMC decoders include the ability to measure and track BMC messages with a frequency offset without message reception corruption, and supporting an infinite message length for the BMC signal because disclosed decoding is not a function of the message length. There is also no conventional requirement for 90 and 270 degree clock recovery as the learning about the frequency of the bit stream is provided during the preamble of the BMC signal. Moreover, checks to self-correct the BMC decoder itself can be implemented with a moving average filter. Immunity is provided to part decoder variance, temperature and process because disclosed measurements reflect these offsets.

Figure 3:
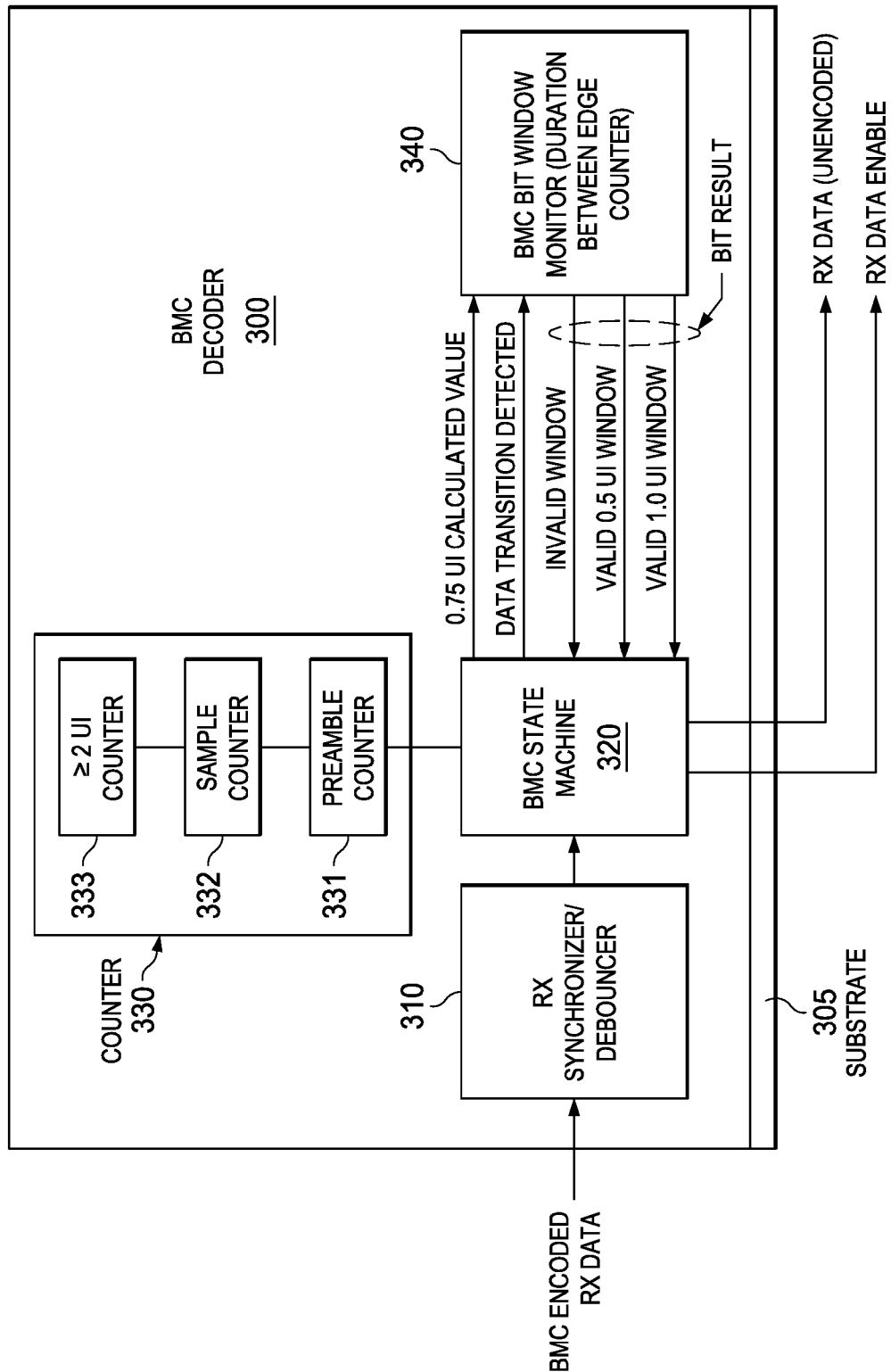
FIG. 3 is block diagram depiction of an example BMC decoder, according to an example embodiment.

FIG. 3 is a block diagram of an example BMC decoder 300 according to an example embodiment. BMC decoder 300 can be implemented in hardware or a suitable combination of hardware and software, and can utilize one or more integrated circuits (ICs) built on a substrate 305 that has at least a semiconductor surface. The substrate may comprise silicon, such as bulk silicon or silicon epi on a bulk silicon substrate. The substrate may also generally comprise other materials, such as elementary semiconductors besides silicon including germanium. The substrate 305 may also generally comprise a compound semiconductor.

As used herein and by way of example and not by limitation, "hardware" can include a combination of discrete components, an integrated circuit, an application-specific integrated circuit, a field programmable gate array, a general purpose processing or server platform, or other suitable hardware. As used herein and by way of example and not by limitation, "software" can include one or more objects, agents, threads, lines of code, subroutines, separate software applications, one or more lines of code or other suitable software structures operating in one or more software applications or on one or more processors, or other suitable software structures. In one example embodiment, software can include one or more lines of code or other suitable software structures operating in a general purpose software application, such as an operating system, and one or more lines of code or other suitable software structures operating in a specific purpose software application.

The substrate 305 has a semiconductor (e.g., silicon) surface including thereon an RX synchronizer/debouncer 310, BMC state machine 320, a counter 330 including a ≥2 UI counter 333, a sample counter 332, and a preamble counter 331 and BMC bit window monitor 340 each coupled to the BMC state machine 320. The BMC bit window monitor 340 implements determining a duration between BMC signal edges. The RX synchronizer/debouncer 310 receives BMC encoded RX data (from a BMC transmitter) including a preamble and a data payload which is coupled to the BMC state machine 320 with the counter 330 and BMC bit window monitor 340 for implementing a disclosed method of BMC signal decoding. RX synchronizer/debouncer's 310 functions include synchronizing the asynchronous BMC input signal to a clock which is common to the RX packet engine and also removing any edge noise from the BMC signal. In one embodiment, all the blocks for BMC decoder 300 shown in FIG. 3 are implemented in hardware (e.g., on a silicon substrate).

From the preamble the BMC state machine 320 measures a total duration spanning at least three transitions to provide a ≥2 UI duration measure, and is shown outputting a 0.75 UI calculated value obtained from the ≥2 UI duration measure as described above, and a signal indication that a data transition (rise or fall) is detected to the BMC bit window monitor 340. The BMC bit window monitor 340 uses the 0.75 UI calculated value to evaluate each window in the data payload of the message it receives and generates a bit result by deciding whether the window is an invalid window, shown using a valid 0.5 UI window (a "1" bit), or a valid 1.0 UI widow (a "0" bit), where the bit result is coupled to the BMC state machine 320 which uses the bit results to output RX unencoded data as a data stream with clock and data, and optionally also the RX data enable signal shown, generally to an RX packet engine. The BMC bit window monitor 340 besides operating on the data payload also can operate on the preamble in the optional preamble lock step 103 after the frequency lock (step 102) as described above.

Features supported by disclosed BMC decoders include enabling or disabling of the BMC decoding function, and a programmable minimum 0.5 UI and maximum 1 UI allowable input signal transition widths (times). Other features include a programmable debounce of BMC encoded input, automatic measurement of a 0.75 UI threshold for 0.5/1.0 UI bit window determination, and BMC signal decoding of a BMC encoded signal (e.g., a BMC encoded USB power delivery (PD) signal).

EXAMPLES

Disclosed embodiments are further illustrated by the following specific Examples, which should not be construed as limiting the scope or content of this Disclosure in any way.

Figure 4A:
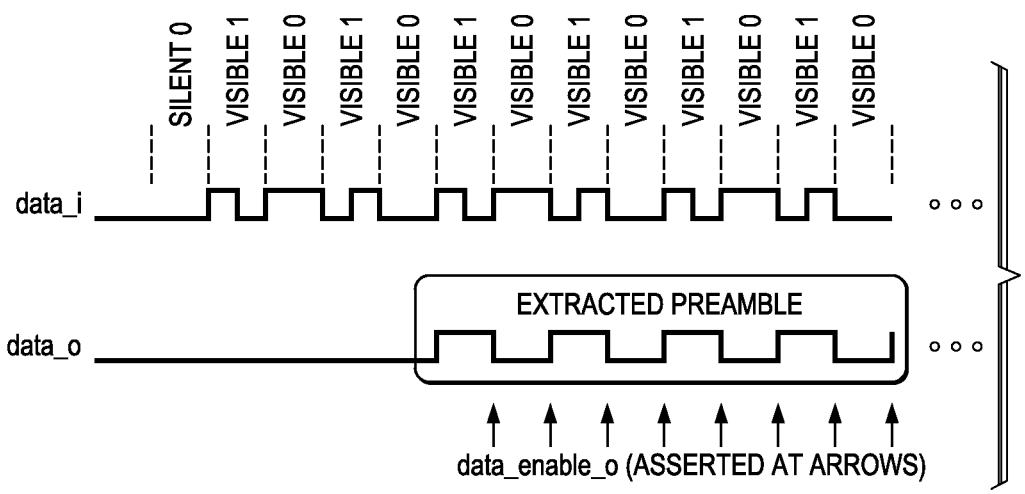
FIGS. 4A and 4B show hand drawn performance data obtained from a disclosed BMC encoder including encoded data in (data_i) and decoded data out (data_o) which reflects actual simulation results.
Figure 4B:
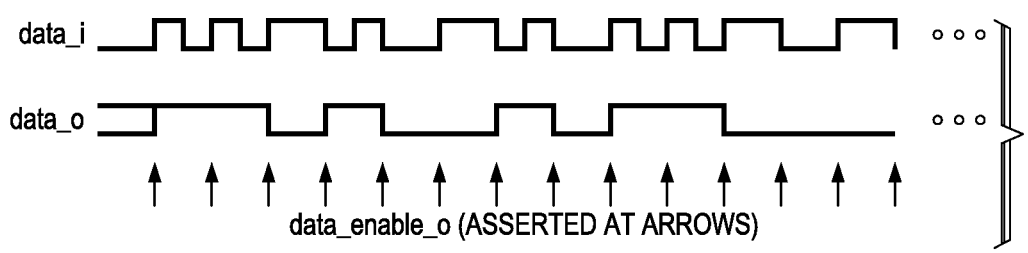

FIGS. 4A and 4B show hand drawn performance data obtained from a disclosed BMC encoder including encoded data in (data_i) and decoded data out (data_o) which reflects actual simulation results. FIG. 4A shows the extracted data when the BMC decoding process is working properly during the preamble. FIG. 4B shows the extracted data when the BMC decoding process is working properly during a random portion of the payload (the data is random) as shown on data_i input.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of biphase mark coding (BMC) signal decoding, comprising:
  receiving a BMC encoded signal (BMC signal) comprising a preamble and data payload at a receiver that includes a BMC decoder including a BMC state machine;
  processing said preamble using said BMC decoder, said processing including:
    measuring a total duration spanning at least three transitions to provide a ≥2 one bit time (UI) duration measure (≥2 UI duration measure);
    generating a calculated 0.75 UI duration value (0.75 UI duration value) from said ≥2 UI duration measure, and
    comparing said 0.75 UI duration value to a programmed UI range, and provided said 0.75 UI duration value is within said programmed UI range, extracting respective bits from said data payload using said 0.75 UI duration value to obtain unencoded data.

2. The method of claim 1, wherein said processing further comprises before said comparing determining if said 0.75 UI duration value is within said programmed UI range by observing a programmed number of 0,1 bit pairs in said preamble, and only proceeding to said comparing if said 0.75 UI duration value is determined to be within said programmed UI range.

3. The method of claim 1, wherein said processing further comprises repeating said measuring a plurality of times and averaging resulting additional ≥2 UI duration measures with said ≥2 UI duration measure to provide said ≥2 UI duration measure.

4. The method of claim 3, wherein said averaging comprises using a simple moving average.

5. The method of claim 2, further comprising programming for setting said number of 0,1 bit pairs utilized.

6. The method of claim 1, wherein said method is independent of a message length of said BMC signal.

7. The method of claim 1, further comprising rejecting said BMC signal if said extracting respective bits determines an invalid bit time or a partial bit time is received.

8. The method of claim 1, further comprising passing said unencoded data as an extracted message to a receive (RX) packet engine.

9. A biphase mark coding (BMC) decoder, comprising:
a BMC state machine;
a counter including a ≥2 UI counter, a sample counter, and a preamble counter coupled to said BMC state machine, and
a BMC bit window monitor coupled to said BMC state machine which implements a duration between signal edge counter;
wherein said BMC state machine is for receiving a BMC encoded signal (BMC signal) including a preamble and data payload and utilizing said counter and said BMC bit window monitor for processing said preamble including:
measuring a total duration spanning at least three transitions to provide a ≥2 one bit time (UI) duration measure (≥2 UI duration measure);
generating a calculated 0.75 UI duration value (0.75 UI duration value) from said ≥2 UI duration measure, and
comparing said 0.75 UI duration value to a programmed UI range, and
provided said 0.75 UI duration value is within said programmed UI range data, said BMC bit window monitor for using said 0.75 UI calculated value to evaluate each window of said data payload for determining a bit result for each said window being an invalid window, a valid 0.5 UI window (a "1" bit), or a valid 1.0 UI widow (a "0" bit) wherein said bit result is coupled to said BMC state machine, and
wherein said BMC state machine is for outputting RX unencoded data.

10. The decoder of claim 9, further comprising a RX synchronizer/debouncer for receiving said BMC encoded signal which is coupled to an input of said BMC state machine.

11. The decoder of claim 9, wherein said processing further comprises before said comparing determining if said 0.75 UI duration value is within said programmed UI range by observing a programmed number of 0,1 bit pairs in said preamble, and only proceeding to said comparing if said 0.75 UI duration value is determined to be within said programmed UI range.

12. The decoder of claim 9, further comprising a substrate having a semiconductor surface, wherein said BMC decoder is formed on said substrate.

13. The decoder of claim 9, wherein said processing further comprises repeating said measuring a plurality of times and averaging resulting additional ≥2 UI duration measures with said ≥2 UI duration measure to provide said ≥2 UI duration measure.

14. The decoder of claim 9, wherein said number of 0,1 bit pairs is user programmable.

15. The decoder of claim 9, wherein said processing is independent of a message length of said BMC signal.

16. The decoder of claim 9, wherein said BMC state machine is for utilizing said counter and said BMC bit window monitor is for rejecting said BMC signal if said extracting respective bits determines an invalid bit time or a partial bit time is received.

* * * * *